(12) United States Patent
Schricker et al.

(10) Patent No.: US 11,404,608 B2
(45) Date of Patent: Aug. 2, 2022

(54) LIGHT EMITTING DEVICE WITH REFLECTIVE SIDEWALL

(71) Applicant: Lumileds LLC, San Jose, CA (US)

(72) Inventors: April Dawn Schricker, Palo Alto, CA (US); Kim Kevin Mai, San Jose, CA (US); Brendan Jude Moran, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/279,680

(22) Filed: Feb. 19, 2019

(65) Prior Publication Data

US 2019/0189857 A1 Jun. 20, 2019

Related U.S. Application Data

(63) Continuation of application No. 15/105,096, filed as application No. PCT/IB2015/050025 on Jan. 2, 2015, now Pat. No. 10,211,374.

(Continued)

(51) Int. Cl.
| | |
|---|---|
| *H01L 33/46* | (2010.01) |
| *H01L 33/48* | (2010.01) |
| *H01L 33/50* | (2010.01) |
| *H01L 33/60* | (2010.01) |
| *H01L 33/00* | (2010.01) |
| *H01L 33/56* | (2010.01) |

(52) U.S. Cl.
CPC ............ *H01L 33/46* (2013.01); *H01L 33/486* (2013.01); *H01L 33/505* (2013.01); *H01L 33/60* (2013.01); *H01L 33/0095* (2013.01); *H01L 33/56* (2013.01); *H01L 2933/005* (2013.01); *H01L 2933/0025* (2013.01); *H01L 2933/0041* (2013.01); *H01L 2933/0058* (2013.01)

(58) Field of Classification Search
CPC ..... H01L 33/46; H01L 33/486; H01L 33/505; H01L 33/60; H01L 33/56; H01L 2933/005; H01L 33/0095; H01L 2933/0025; H01L 2933/0041; H01L 2933/0058; H01L 2924/12041
See application file for complete search history.

(56) References Cited

U.S. PATENT DOCUMENTS 8,860,062 B2  10/2014  Schneider et al.
9,022,828 B2  5/2015  Imai
(Continued)

FOREIGN PATENT DOCUMENTS

DE   102011080458 A1   2/2013
EP      1533851 A2      5/2005
(Continued)

OTHER PUBLICATIONS

EPO as ISA, international Search Report and Written Opinion dated Apr. 9, 2015 from International Application No. PCT/IB2015/050025, filed Jan. 2, 2015, 12 pages.

*Primary Examiner* — Benjamin Tzu-Hung Liu

(57) ABSTRACT

Embodiments of the invention include a light emitting device including a substrate and a semiconductor structure including a light emitting layer. A first reflective layer surrounds the light emitting device. A wavelength converting element is disposed over the light emitting device. A second reflective layer is disposed adjacent a first sidewall of the wavelength converting element.

20 Claims, 4 Drawing Sheets

Related U.S. Application Data

(60) Provisional application No. 61/925,328, filed on Jan. 9, 2014.

(56) References Cited

U.S. PATENT DOCUMENTS

| | | | |
|---|---|---|---|
| 2005/0116635 A1* | 6/2005 | Walson | G02B 6/4249 313/512 |
| 2009/0045416 A1 | 2/2009 | Bierhuizen et al. | |
| 2009/0296367 A1 | 12/2009 | Sekine et al. | |
| 2011/0018017 A1 | 1/2011 | Bierhuizen | |
| 2011/0025190 A1 | 2/2011 | Jagt | |
| 2011/0175117 A1* | 7/2011 | Jagt | H01L 33/46 257/E33.061 |
| 2012/0086029 A1 | 4/2012 | Yu | |
| 2013/0069525 A1* | 3/2013 | Imai | F21V 23/00 445/44 |
| 2014/0054638 A1 | 2/2014 | Lester et al. | |
| 2014/0124802 A1 | 5/2014 | Kashiwagi et al. | |
| 2014/0167092 A1 | 6/2014 | Gartner et al. | |
| 2014/0319560 A1* | 10/2014 | Tischler | H01L 33/56 257/98 |
| 2016/0155912 A1* | 6/2016 | Burger | H01L 33/505 438/27 |

FOREIGN PATENT DOCUMENTS

| | | |
|---|---|---|
| EP | 2216834 A1 | 8/2010 |
| JP | 2007-019096 A | 1/2007 |
| JP | 2010-192629 A | 9/2010 |
| JP | 2013-251417 A | 12/2013 |
| KR | 10-2011-0070989 A | 6/2011 |
| WO | 2009074919 A1 | 6/2009 |
| WO | 2010035206 A1 | 4/2010 |
| WO | 2010/143114 A1 | 12/2010 |
| WO | 2012007245 A1 | 1/2012 |

* cited by examiner

LIGHT EMITTING DEVICE WITH REFLECTIVE SIDEWALL

CROSS REFERENCE TO RELATED APPLICATIONS

This application is a continuation of U.S. patent application Ser. No. 15/105,096 titled "LIGHT EMITTING DEVICE WITH REFLECTIVE SIDEWALL" and filed Jun. 6, 2006 as a § 371 application of International Application No. PCT/IB2015/050025, which was filed on Jan. 2, 2015 and also titled "LIGHT EMITTING DEVICE WITH REFLECTIVE SIDEWALL." International Application No. PCT/IB2015/050025 claims priority to U.S. Provisional Application No. 61/925,328 filed Jan. 9, 2014. U.S. patent application Ser. No. 15/105,096, International Application No. PCT/IB2015/050025, and U.S. Provisional Application No. 61/925,328 are each incorporated herein by reference in their entirety.

FIELD OF THE INVENTION

The invention relates to a light emitting device with a reflective sidewall.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

LEDs where a majority of light is extracted through the top of the device may be formed by molding a reflective material around the sides of the device, to prevent light from escaping from the sides. Molding is illustrated in FIG. 1, which is described in more detail in US 2011/0018017. FIG. 1 illustrates the submount wafer 360 and LEDs 100 attached to the submount. Lines are drawn on the wafer 360 illustrating where the wafer 360 will be later sawed or broken for singulation.

A mold 400, also known as a chase, has indentions 420 that are preferably shallow to ensure that the tops of the LEDs contact or come very close to the flat bottom surface of each indention 420. The indentions 420 are slightly wider than the LEDs 100, where the difference will be the thickness of the molded material covering the sides of the LEDs 100. A viscous mixture 440 of silicone and $TiO_2$ is precisely dispensed over the mold 400 to fill the indentions 420 and also create a thin layer between the indentions 420. The submount wafer 360 and mold 400 are brought together under pressure so that the LEDs 100 are immersed in the mixture 440. When the tops of the LEDs 100 are just touching the bottoms of the indentations 420, pressure is maintained and the silicone is cured, such as by heating. The wafer 360 and mold 400 are then separated, and the hardened silicone/$TiO_2$ 460 may be further cured by heating or UV. The submount wafer 360 is then singulated along the lines by sawing or breaking.

The relatively thick layer of silicone/$TiO_2$ covering the sides of the LED 100 reflects substantially all of the LED side light (e.g., at least 75%). After any reflection off the silicone/$TiO_2$ sidewall, a portion of the reflected light will ultimately exit through the top surface of the LED 100 (the top surfaces of the LEDs 100 are facing down in the orientation illustrated in FIG. 1).

SUMMARY

It is an object of the invention to provide a light emitting device with a reflective sidewall, with flexibility in the placement of the reflective material.

Embodiments of the invention include a light emitting device including a substrate and a semiconductor structure including a light emitting layer. A first reflective layer surrounds the light emitting device. A wavelength converting element is disposed over the light emitting device. A second reflective layer is disposed adjacent a first sidewall of the wavelength converting element.

A method according to embodiments of the invention includes attaching a light emitting device to a mount. A first reflective layer is formed adjacent a sidewall of the light emitting device. A wavelength converting element is disposed over the light emitting device. A second reflective layer is formed adjacent a sidewall of the wavelength converting element.

DETAILED DESCRIPTION

Figure 1:
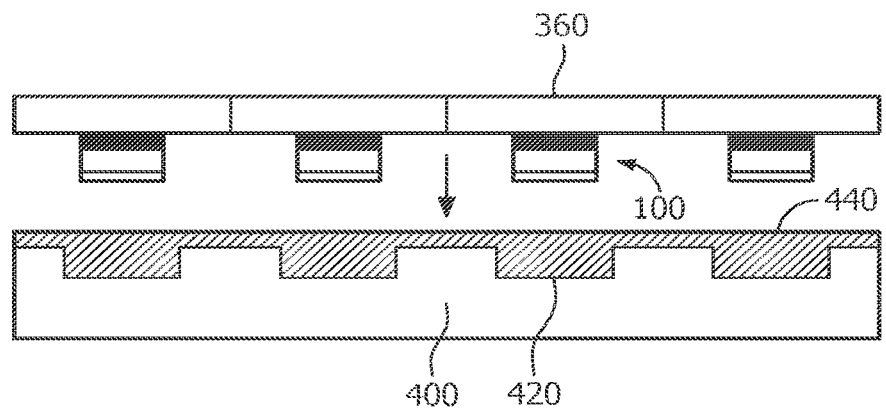
FIG. 1 illustrates molding reflective material over an LED.

In embodiments of the invention, a reflective material is molded over a light emitting device, a wavelength converting element is disposed over the light emitting device, then an additional reflective layer is formed over at least a portion of the wavelength converting element. Embodiments of the present invention offer flexibility in the location of the reflective material, which is not available in the method illustrated in FIG. 1.

Figure 3:
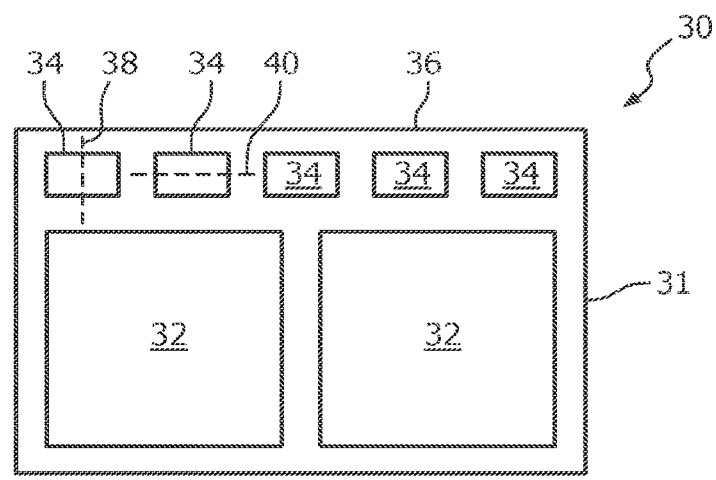
FIG. 3 illustrates an automotive headlamp.

FIG. 3 illustrates an example of a head lamp for an automobile. The headlamp 30 includes five light sources 34. Though light sources 34 are often used, for example, as low beam head lights and/or as day time running lights, light sources 34 may be used for any appropriate purpose. Light sources 34 are wavelength converted III-nitride LEDs in embodiments of the invention. Light sources 34 are disposed on a substrate 31. Bond pads 32 on the substrate are used to form electrical connections to the light sources 34. Light sources 34 may be electrically connected to bond pads 32 through traces or conductive vias formed within or on the surface of substrate 31 (not shown in FIG. 3).

Though in the examples described herein the semiconductor light emitting devices are III-nitride LEDs that emit blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

Figure 2:
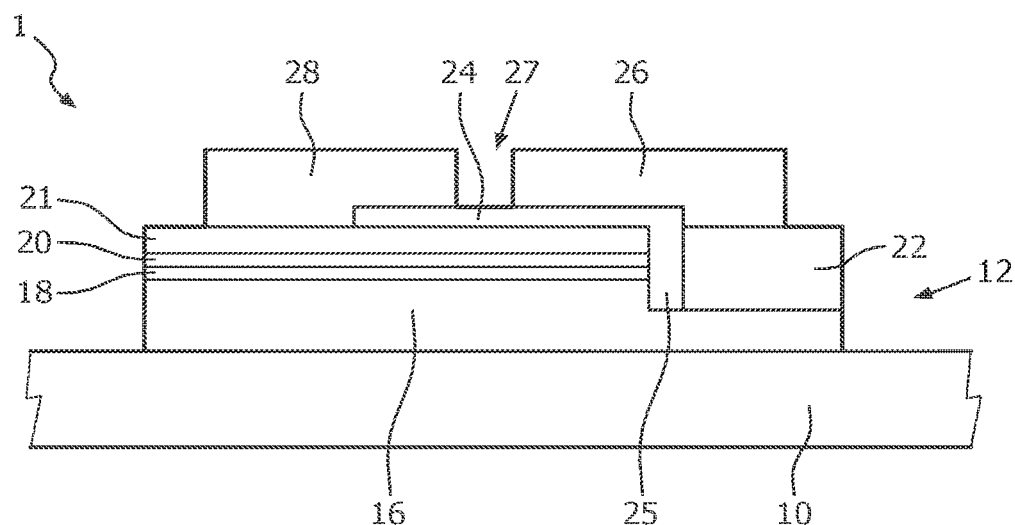
FIG. 2 illustrates one example of a III-nitride LED.

FIG. 2 illustrates a III-nitride LED 1 that may be used in embodiments of the present invention. Any suitable semiconductor light emitting device may be used and embodiments of the invention are not limited to the device illustrated in FIG. 2. The device of FIG. 2 is formed by growing a III-nitride semiconductor structure on a growth substrate 10 as is known in the art. The growth substrate is often sapphire but may be any suitable substrate such as, for example, SiC, Si, GaN, or a composite substrate. A surface of the growth substrate on which the III-nitride semiconductor structure is grown may be patterned, roughened, or textured before growth, which may improve light extraction from the device. A surface of the growth substrate opposite the growth surface (i.e. the surface through which a majority of light is extracted in a flip chip configuration) may be patterned, roughened or textured before or after growth, which may improve light extraction from the device.

The semiconductor structure includes a light emitting or active region sandwiched between n- and p-type regions. An n-type region 16 may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region 18 is grown over the n-type region. Examples of suitable light emitting regions include a single thick or thin light emitting layer, or a multiple quantum well light emitting region including multiple thin or thick light emitting layers separated by barrier layers. A p-type region 20 may then be grown over the light emitting region. Like the n-type region, the p-type region may include multiple layers of different composition, thickness, and dopant concentration, including layers that are not intentionally doped, or n-type layers.

After growth, a p-contact is formed on the surface of the p-type region. The p-contact 21 often includes multiple conductive layers such as a reflective metal and a guard metal which may prevent or reduce electromigration of the reflective metal. The reflective metal is often silver but any suitable material or materials may be used. After forming the p-contact 21, a portion of the p-contact 21, the p-type region 20, and the active region 18 is removed to expose a portion of the n-type region 16 on which an n-contact 22 is formed. The n- and p-contacts 22 and 21 are electrically isolated from each other by a gap 25 which may be filled with a dielectric such as an oxide of silicon or any other suitable material. Multiple n-contact vias may be formed; the n- and p-contacts 22 and 21 are not limited to the arrangement illustrated in FIG. 2. The n- and p-contacts may be redistributed to form bond pads with a dielectric/metal stack, as is known in the art.

In order to form electrical connections to the LED 1, one or more interconnects 26 and 28 are formed on or electrically connected to the n- and p-contacts 22 and 21. Interconnect 26 is electrically connected to n-contact 22 in FIG. 2. Interconnect 28 is electrically connected to p-contact 21. Interconnects 26 and 28 are electrically isolated from the n- and p-contacts 22 and 21 and from each other by dielectric layer 24 and gap 27. Interconnects 26 and 28 may be, for example, solder, stud bumps, gold layers, or any other suitable structure.

Many individual LEDs are formed on a single wafer then diced from a wafer of devices. The semiconductor structure, the n- and p-contacts 22 and 21, and the interconnects 26 and 28 excluding the substrate 10 are represented in the following figures by block 12.

Figure 4:
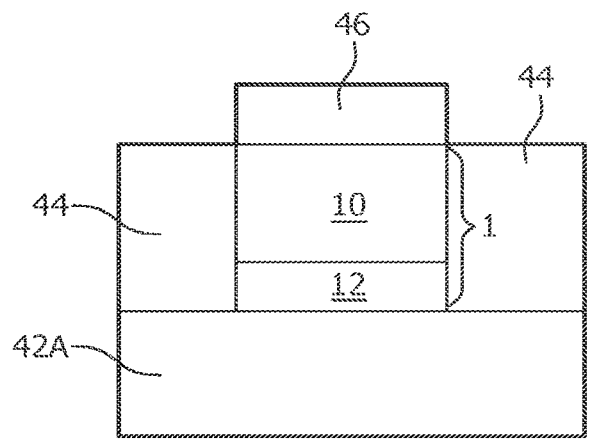
FIGS. 4 and 5 are cross sectional views of an LED in the headlamp of FIG. 3.
Figure 5:
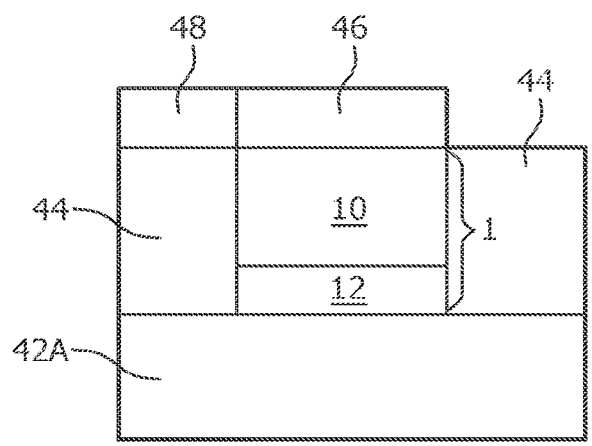

Returning to FIG. 3, the LEDs 34 are located at the top 36 of the head lamp and are therefore the closest light sources to the driver. Accordingly, it is desirable to direct light away from the edge of the LEDs 34 that is closest to the top 36, in order to avoid causing glare visible to the driver. A reflector layer is formed to direct light away from the top 36 of head lamp 30. FIG. 4 illustrates a cross section of an LED 34 taken along axis 38. FIG. 5 illustrates a cross section of an LED 34 taken along axis 40.

In FIGS. 4 and 5, an LED 1, which may be the device illustrated in FIG. 2 or any other suitable device, is electrically and physically connected to a mount 42A. LED 1 is attached to mount 42A with the semiconductor structure and contacts facing down, such that light is extracted through the substrate 10. A reflective material 44 is formed adjacent the four sidewalls of LED 1. Reflective material 44 may be, for example, reflective particles such as $TiO_2$ disposed in a transparent material, such as silicone or silicone molding compound. The reflective material 44 extends to the top of the substrate 10 of LED 1. The reflective material 44 is at least 90% reflective in some embodiments and at least 95% reflective in some embodiments.

A wavelength converting layer 46 is disposed over the substrate 10 of LED 1. Wavelength converting layer 46 may be attached to substrate 10 by gluing, as described below. In some embodiments, the top of reflective material 44 is below the top surface of the substrate 10, to reduce or eliminate interaction between reflective material 44 and the glue, which can cause cracking of the reflective material 44 or other reliability problems.

An additional reflective material 48 is disposed over a side of the wavelength converting layer 46, as illustrated in FIG. 4. The additional reflective material 48 may reduce the amount of light emitted from at least one side of wavelength converting layer 46. The additional reflective material 48 may be positioned adjacent the top 36 of headlamp 30, in order to reduce glare apparent to the driver. The additional reflective material 48 is not formed on the other sidewalls of the wavelength converting layer which are not proximate the top of headlamp 30. The additional reflective material 48 is at least 90% reflective in some embodiments and at least 95% reflective in some embodiments. In the alternative, additional reflective material 48 may be part of reflective material 44. For example, reflective material 44 may be formed higher than substrate 10 then selectively removed.

The LEDs illustrated in FIGS. 4 and 5 may be formed by the process illustrated below in FIGS. 6, 7, 8, 9, and 10. Although only two LEDs 1A and 1B are shown, many LEDs or in some cases only a single LED may be processed together on a single mount wafer 42.

Figure 6:
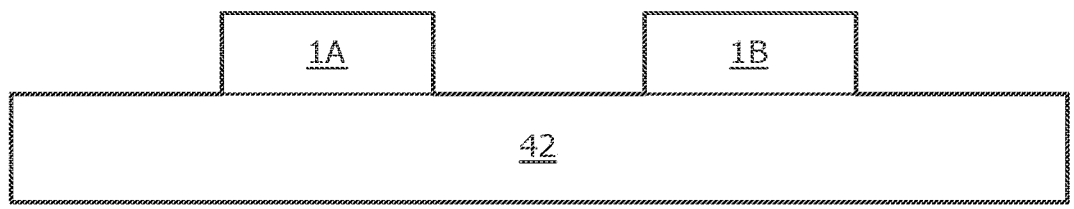
FIG. 6 illustrates LEDs attached to a mount.

In FIG. 6, LEDs 1A, 1B are attached to a tile or a mount wafer 42. (The wafer of mounts is shown in FIGS. 6-10 as a single, continuous structure. After the processing illustrated in FIGS. 6-10, the wafer is diced for example into individual mounts 42A, 42B etc. each corresponding to a single LED, as illustrated in FIG. 10.) Mount wafer 42 may be, for example, silicon, metal, ceramic, or any other suitable material. Mount wafer 42 may include integrated circuitry. LEDs 1 may be attached to mount wafer 42 by gold stud bumps, gold layers, solder, thermosonic bonding, ultrasonic bonding, or any other suitable method or material. In some embodiments, LEDs 1A, 1B are attached to metal contact pads disposed on the top surface of mount wafer 42. These contact pads are connected to metal contact pads on the bottom surface of mount wafer 42, for example by traces formed within and/or on the surface of the mount. The bottom contact pads may be used to connect the LEDs 1A, 1B to any suitable structure such as a PC board or other substrate that supports the light sources 32 and 34 in headlamp 30 of FIG. 3. Top and bottom contacts on the mount are known in the art and not shown in FIG. 6.

In some embodiments, an underfill is injected between LEDs 1 and mount wafer 42. Underfill may support LEDs 1 and/or seal the LEDs 1 against contaminants. Excessive underfill may be removed by any suitable technique such as microbead blasting. The use and removal of underfill is known in the art.

Figure 7:
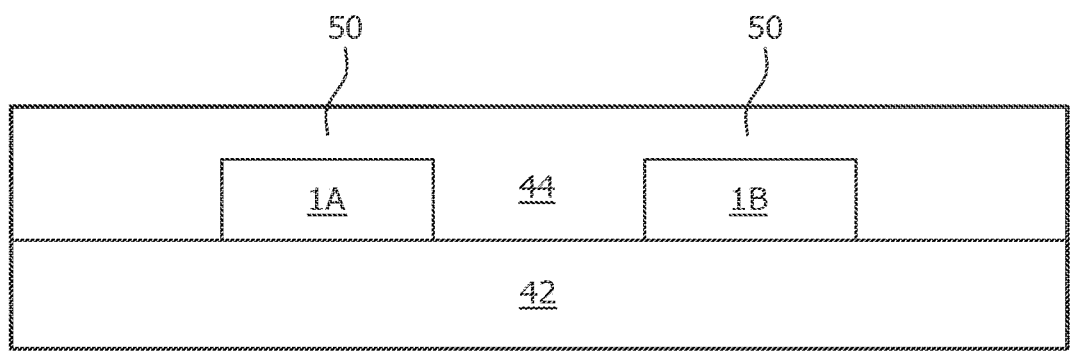
FIG. 7 illustrates the structure of FIG. 6 after forming a reflective layer over the LEDs.

In FIG. 7, a reflective material 44 is molded over LEDs 1A, 1B. For example, a mold may be disposed over a wafer 42 of mounts on which LEDs 1A, 1B have been mounted. The mold may include indentations that correspond to the shape of the LEDs 1A, 1B, though it need not. A molding compound, which is a viscous mixture of a matrix material (often silicone, epoxy, or glass, but any suitable material may be used) and reflective particles (often $TiO_2$ but any suitable material may be used), is disposed over the mold to fill the mold. The wafer of mounts 42 and LEDs 1A, 1B and the mold are brought together under pressure so that the LEDs 1A, 1B are immersed in the molding compound. A vacuum may be created between the mold and the mount wafer. The molding compound is cured, such as by heating. The mount wafer and mold are then separated. The hardened molding compound may be further cured, for example by heating or exposing to ultraviolet radiation. After curing, the molding compound is generally reflective, white, and opaque.

Though in the above description, the transparent material is a thermoset molding compound that is molded, any material that supports the reflective particles and can be disposed around the LEDs 1A, 1B may be used. In some embodiments, rather than molding compound, a sol gel material is used. In such embodiments, a mixture of reflective particles and sol gel liquid may be dispensed over the LEDs 1A, 1B, then water is evaporated from the sol gel liquid, leaving a silicate network that is essentially a glass with reflective particles embedded in the silicate network.

In some embodiments, a material with a high thermal conductivity; for example, with a higher thermal conductivity than the transparent material and/or the reflective particles, may be added to the mixture. For example, the material with high thermal conductivity may have a thermal conductivity higher than that of common silicone materials, which may have a thermal conductivity around 0.1-0.2 W/mK.

Figure 8:
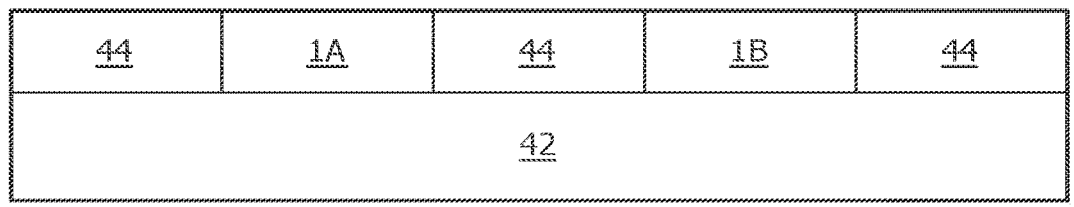
FIG. 8 illustrates the structure of FIG. 7 after removing the reflective material over the tops of the LEDs.

In FIG. 7, reflective material 50 may be disposed over the tops of LEDs 1A, 1B. In FIG. 8, the reflective material 50 over the LEDs is removed. The excess reflective material 50 may be removed by wet beat blasting or any other suitable technique. After removing excessive reflective material, the top surface of the reflective material 44 may be at the same level as the top surface of LEDs 1A, 1B, as illustrated in FIG. 8, though this is not required: the top surface of the reflective material 44 may be higher or lower than the top surface of the LEDs 1A, 1B.

Figure 9:
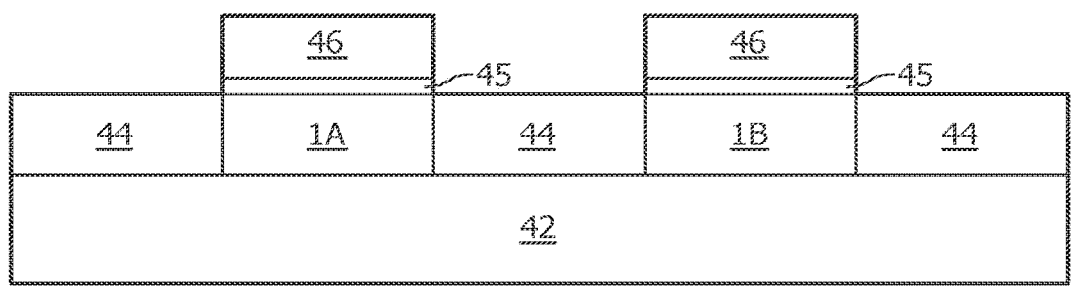
FIG. 9 illustrates the structure of FIG. 8 after disposing wavelength converting layers over the LEDs.
Figure 10:
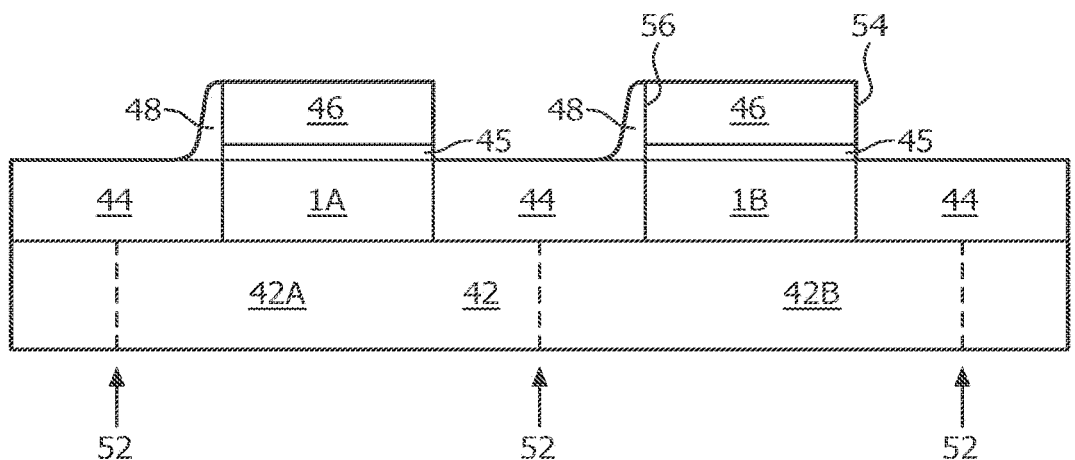
FIG. 10 illustrates the structure of FIG. 9 after forming an additional reflective layer over a side of the wavelength converting layer.

In FIG. 9, wavelength converting elements 46 are disposed over the LEDs 1A, 1B. Wavelength converting elements may be, in some embodiments, pre-formed elements that are attached to the LEDs 1A, 1B by a layer of adhesive 45. Adhesive 45 is often silicone but any suitable material may be used. Examples of pre-formed wavelength converting elements 46 include powder phosphors that are sintered or otherwise formed into ceramic sheets, then singulated into individual platelets sized for a single LED, and powder phosphors that are disposed in transparent material such as silicone or glass that is rolled, cast, or otherwise formed into a sheet, then singulated into individual platelets. Wavelength converting elements 46 need not be pre-formed elements in some embodiments, and may be formed by any suitable technique including lamination, molding, spray-coating, spin-coating, or screen-printing.

The wavelength converting elements 46 include a wavelength converting material which may be, for example, conventional phosphors, organic phosphors, quantum dots, organic semiconductors, II-VI or III-V semiconductors, II-VI or III-V semiconductor quantum dots or nanocrystals, dyes, polymers, or other materials that luminesce. The wavelength converting material absorbs light emitted by the LED and emits light of one or more different wavelengths. Unconverted light emitted by the LED is often part of the final spectrum of light extracted from the structure, though it need not be. Examples of common combinations include a blue-emitting LED combined with a yellow-emitting wavelength converting material, a blue-emitting LED combined with green- and red-emitting wavelength converting materials, a UV-emitting LED combined with blue- and yellow-emitting wavelength converting materials, and a UV-emitting LED combined with blue-, green-, and red-emitting wavelength converting materials. Wavelength converting materials emitting other colors of light may be added to tailor the spectrum of light extracted from the structure.

As illustrated in FIG. 9, the top surfaces of wavelength converting elements 46 are often higher than the top surface of reflective material 44. In some embodiments, reflective material 44 does not cover any portion of a sidewall of the wavelength converting element 46.

In FIG. 10, an additional reflective material 48 is disposed on at least one side of the wavelength converting element of LEDs 1A, 1B. In the headlamp illustrated in FIG. 3, the LEDs 34 (which are, for example, singulated LEDs 1A, 1B) have an additional quantity of reflective material 48 disposed on one side of the LEDs 34, the side of the LEDs 34 oriented toward the top 36 of the headlamp. For other applications, additional reflective material 48 may be disposed on more than one side of the LEDs 1A, 1B.

Additional reflective material 48 may be, for example, a reflective material such as $TiO_2$ particles disposed in a transparent material such as silicone. Any suitable reflective material and transparent material may be used. Additional reflective material 48 may be formed by any suitable technique such as, for example, jet dispensing over the sidewall of wavelength converting element 46, then curing the additional reflective material 48 for example by heating or any other suitable technique. In some embodiments, additional reflective material 48 and reflective layer 44 are formed by different techniques. The additional reflective material 48 may be the same material as reflective layer 44, or a different material.

In the alternative, additional reflective material 48 may be a portion of reflective layer 44. Removal as shown in FIG. 8 may be via a masking step such that additional reflective material 48 remains on one more sides of the LEDs 1A, 1B.

In the device illustrated in FIG. 10, the additional reflective material 48 is arranged such that a majority of light emitted toward the sidewall 56 of wavelength converting element 46 is reflected back into the wavelength converting element, while a majority of light emitted toward the sidewall 54 of wavelength converting element 46 is extracted from the wavelength converting element. Additional reflective material 48 need not be limited to a single surface of the wavelength converting element 46 and may be formed on any surface as appropriate to the application for which the LEDs 1A, 1B is to be used.

Individual LEDs 1A, 1B or groups of LEDs 1A, 1B may then be separated from the wafer, for example by cutting through the mount wafer 42 and reflective material 44 in regions 52.

The LEDs 1A, 1B are then ready to be incorporated into headlamp 30 of FIG. 3 or any other suitable device. Note that FIGS. 6, 7, 8, 9, and 10 illustrate manufacturing the devices 34 illustrated in FIGS. 3, 4, and 5. Accordingly, the orientation of the additional reflective material 48 on the devices is different on the manufacturing wafer illustrated in FIG. 10 than in the headlamp 30 of FIG. 3.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is claimed is:

1. A device comprising:
    a light emitting device comprising a semiconductor light emitting layer, side walls, and a top surface;
    a wavelength converting element comprising a bottom surface, a top light emitting surface, and side walls connecting the bottom surface and the top light emitting surface, each side wall of the wavelength converting element substantially aligned with one of the side walls of the light emitting device, the wavelength converting element disposed over the top surface of the light emitting device with the bottom surface of the wavelength converting element facing the top surface of the light emitting device;
    a first reflective layer contacting and conforming to side walls of the light emitting device without extending along the side walls of the wavelength converting element as far as the top light emitting surface of the wavelength converting element; and
    a second reflective layer disposed to contact and conform to only a first side wall of the wavelength converting element without being adjacent to a second side wall of the wavelength converting element.

2. The device of claim 1, wherein in operation a majority of light impinging on the second reflective layer from within the wavelength converting element is reflected back into the wavelength converting element.

3. The device of claim 1, wherein the first reflective layer does not extend along the side walls of the light emitting device as far at the top surface of the light emitting device.

4. The device of claim 1, wherein the first reflective layer does not extend along the side walls of the light emitting device beyond the top surface of the light emitting device.

5. The device of claim 1, wherein the wavelength converting element is formed separately from the light emitting device and attached to the light emitting device by an adhesive.

6. The device of claim 1, wherein the second side wall of the wavelength converting element is positioned oppositely from the first sidewall of the wavelength converting element and not covered by a reflective layer.

7. The device of claim 6, wherein the second reflective layer is arranged such that in operation a majority of light emitted toward the first sidewall is reflected into the wavelength converting element and a majority of light emitted toward the second sidewall of the wavelength converting element is extracted from the wavelength converting element.

8. The device of claim 1, wherein the first reflective layer is at least 95% reflective.

9. The device of claim 1, wherein the first reflective layer comprises reflective particles disposed in a transparent material.

10. The device of claim 1, wherein the second reflective layer is disposed adjacent only a single sidewall of the wavelength converting element.

11. The device of claim 1, wherein the second reflective layer is at least 95% reflective.

12. The device of claim 1, wherein:
    the first reflective layer does not extend along the side walls of the light emitting device beyond the top surface of the light emitting device; and
    the wavelength converting element comprises a second side wall positioned oppositely from the first sidewall of the wavelength converting element and not covered by a reflective layer.

13. The device of claim 12, wherein the second reflective layer is disposed adjacent only the first sidewall of the wavelength converting element.

14. The device of claim 12, wherein the first reflective layer and the second reflective layer each comprises reflective particles disposed in a transparent material.

15. The device of claim 12, wherein:
    the second reflective layer is disposed adjacent only the first sidewall of the wavelength converting element; and
    the first reflective layer and the second reflective layer each comprises reflective particles disposed in a transparent material.

16. A method comprising:
    attaching a light emitting device to a mount, the light emitting device comprising a semiconductor light emitting layer, side walls, and a top surface;
    disposing a wavelength converting element comprising a bottom surface, a top light emitting surface, and side walls connecting the bottom surface and the top light emitting surface over the light emitting device with the bottom surface of the wavelength converting element facing the top surface of the light emitting device such that each side wall of the wavelength converting element is substantially aligned with one of the side walls of the light emitting device;

forming a first reflective layer contacting and conforming to the side walls of the light emitting device without extending along side walls of the wavelength converting element as far as the top light emitting surface of the wavelength converting element; and forming a second reflective layer disposed to contact and conform to only a first side wall of the wavelength converting element without being adjacent to a second side wall of the wavelength converting element.

17. The method of claim 16, comprising forming the second reflective layer after forming the first reflective layer.

18. The method of claim 16, comprising forming the first reflective layer by molding and forming the second reflective layer by jet dispensing.

19. The method of claim 16, comprising forming the first reflective layer and the second reflective layer by different techniques.

20. The method of claim 16, wherein the wavelength converting element is pre-formed, comprising gluing the wavelength converting element to the top surface of the light emitting device.

\* \* \* \* \*